(12) United States Patent
Kinzer

(10) Patent No.: US 7,202,525 B2
(45) Date of Patent: Apr. 10, 2007

(54) TRENCH MOSFET WITH TRENCH TIP IMPLANTS

(75) Inventor: Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/081,893

(22) Filed: Feb. 28, 2005

(65) Prior Publication Data

US 2005/0224870 A1   Oct. 13, 2005

Related U.S. Application Data

(60) Provisional application No. 60/549,267, filed on Mar. 1, 2004.

(51) Int. Cl.
   *H01L 29/94* (2006.01)
(52) U.S. Cl. .............. 257/330; 257/213; 257/288; 257/327; 257/329; 257/E29.257; 438/142; 438/197; 438/268; 438/270
(58) Field of Classification Search .................. None
   See application file for complete search history.

(56) References Cited

U.S. PATENT DOCUMENTS

| | | | |
|---|---|---|---|
| 5,485,027 A | 1/1996 | Williams et al. | 257/343 |
| 5,929,481 A | 7/1999 | Hshieh et al. | 257/328 |
| 6,031,265 A * | 2/2000 | Hshieh | |
| 6,262,453 B1 * | 7/2001 | Hshieh | |
| 6,396,090 B1 * | 5/2002 | Hsu et al. | |
| 6,465,843 B1 * | 10/2002 | Hirler et al. | |
| 2002/0185680 A1 * | 12/2002 | Henninger et al. | |
| 2003/0032247 A1 | 2/2003 | Darwish et al. | 438/270 |
| 2004/0038467 A1 * | 2/2004 | Darwish et al. | |

OTHER PUBLICATIONS

A Novel Technique for Fabricating High Reliaboe Trench DMOSFETs Using Self-Align Technique and Hydrogen Annealing Jongdae Kim et al., IEEE Transactions on Electron Devices, vol. 50, No. 2, Feb. 2003.
A New Power W-Gated Trench MOSFET (WMOSFET) with High Switching Performance, Mohamed Darwish et al., pp. 24-27, ISPSD 2003, Apr. 14-17, Cambridge, United Kingdom.

* cited by examiner

*Primary Examiner*—Leonardo Andujar
*Assistant Examiner*—Kevin Quinto
(74) *Attorney, Agent, or Firm*—Ostrolenk, Faber, Gerb & Soffen, LLP

(57) ABSTRACT

A trench type power semiconductor device includes a channel region atop an epitaxially silicon layer and a plurality of shallow gate electrode trenches within the channel region such that the bottom of each trench extends to a distance above the junction defined by the channel region and epitaxially silicon layer. Formed at the bottom of each trench within the channel region are trench tip implants of the same conductivity as the epitaxial silicon layer. The trench tip implants extend through the channel region and into the epitaxially silicon layer. The tips effectively pull up the drift region of the device in a localized fashion. In addition, an insulation layer lines the sidewalls and bottom of each trench such that the insulation layer is thicker along the trench bottoms than along the trench sidewalls. Among other benefits, the shallow trenches, trench tips, and variable trench insulation layer allow for reduced on-state resistance and reduced gate-to-drain charge.

19 Claims, 11 Drawing Sheets

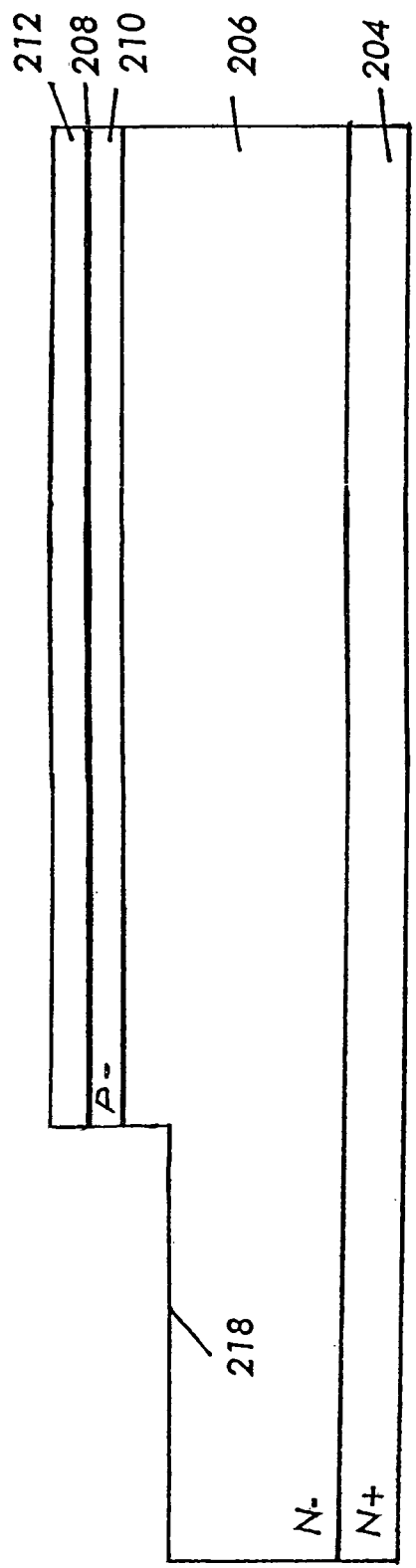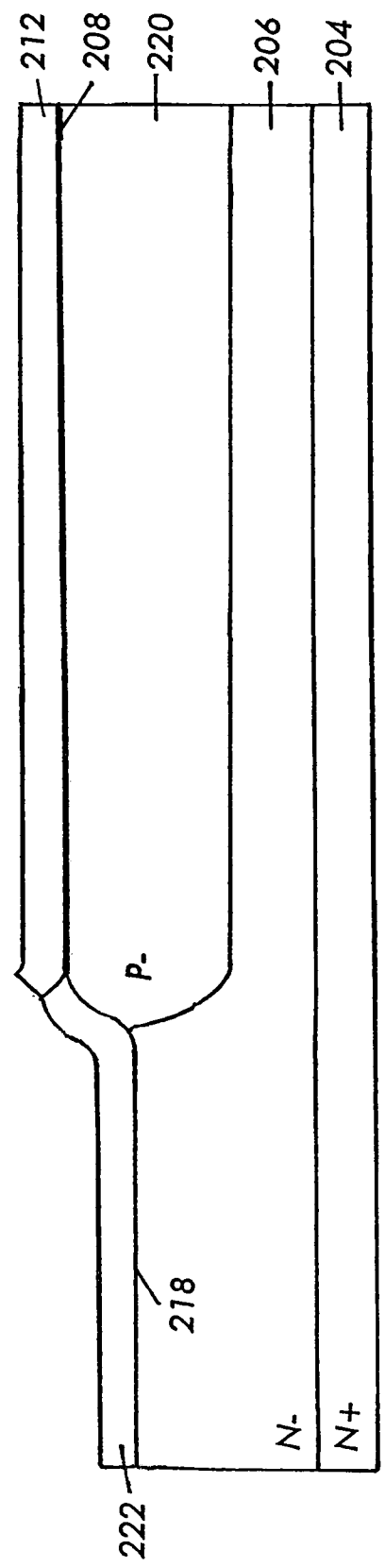
FIG. 3C
FIG. 3D

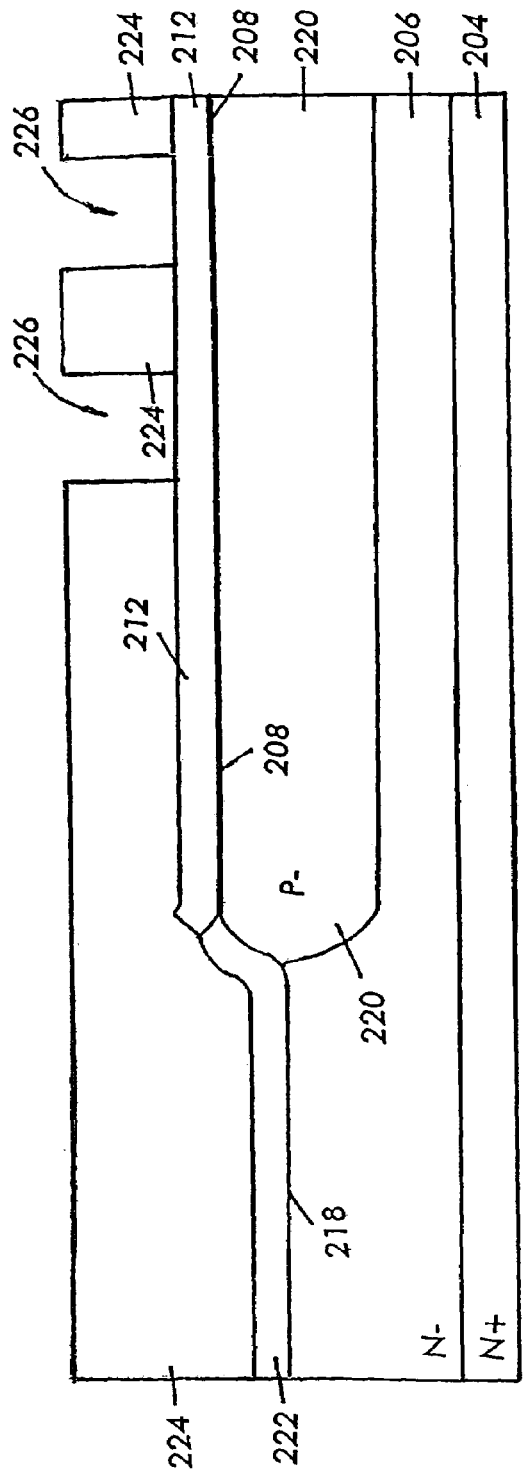
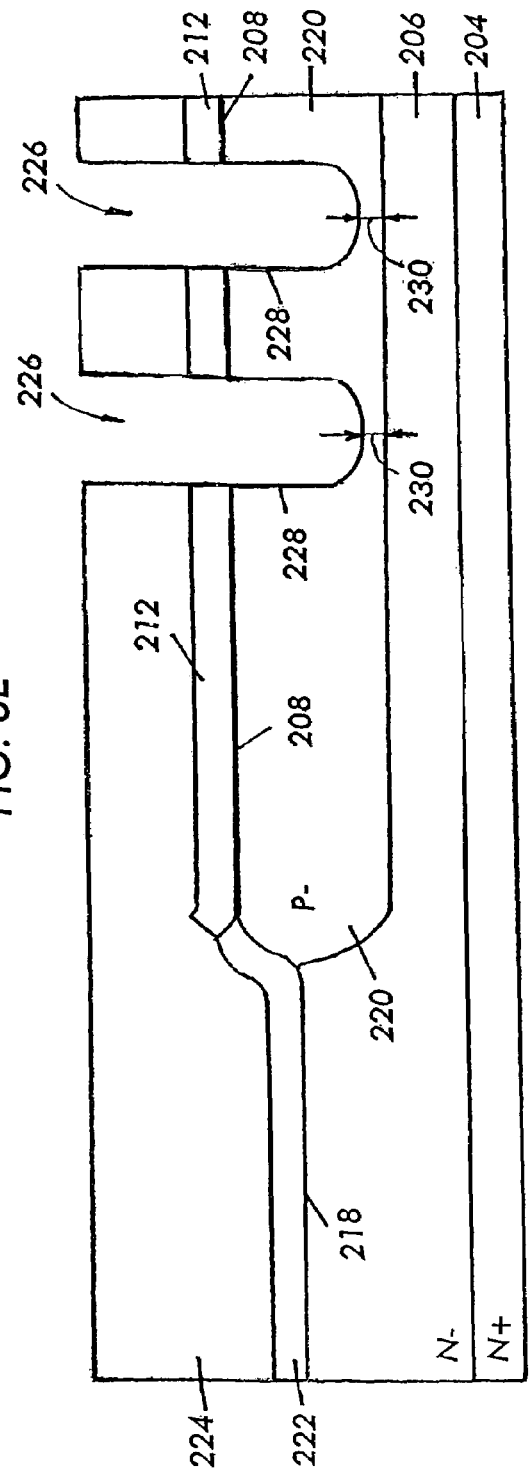
FIG. 3E
FIG. 3F

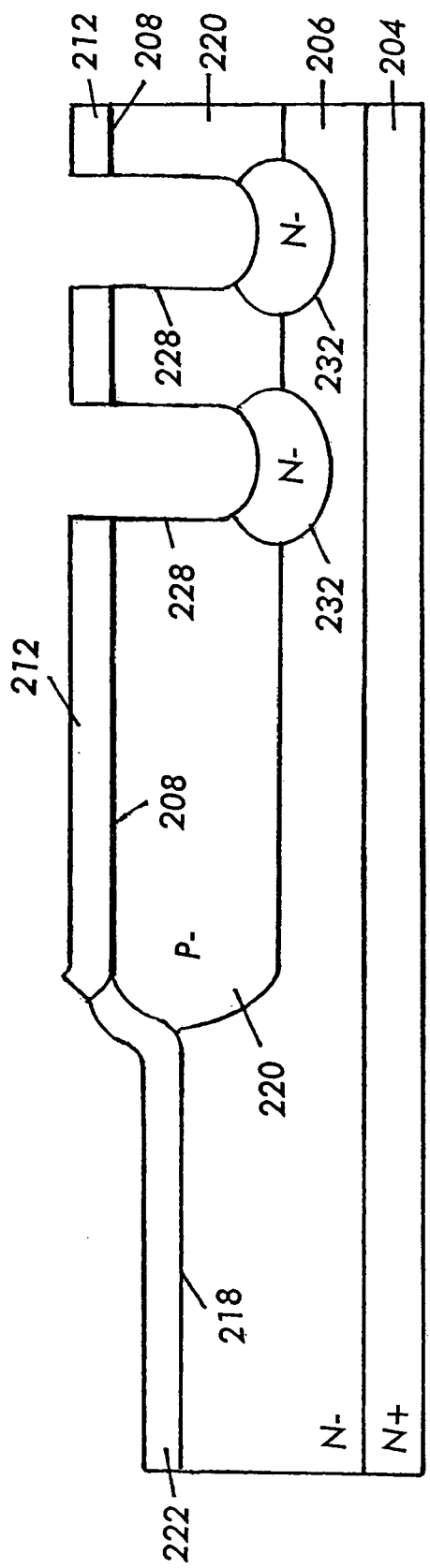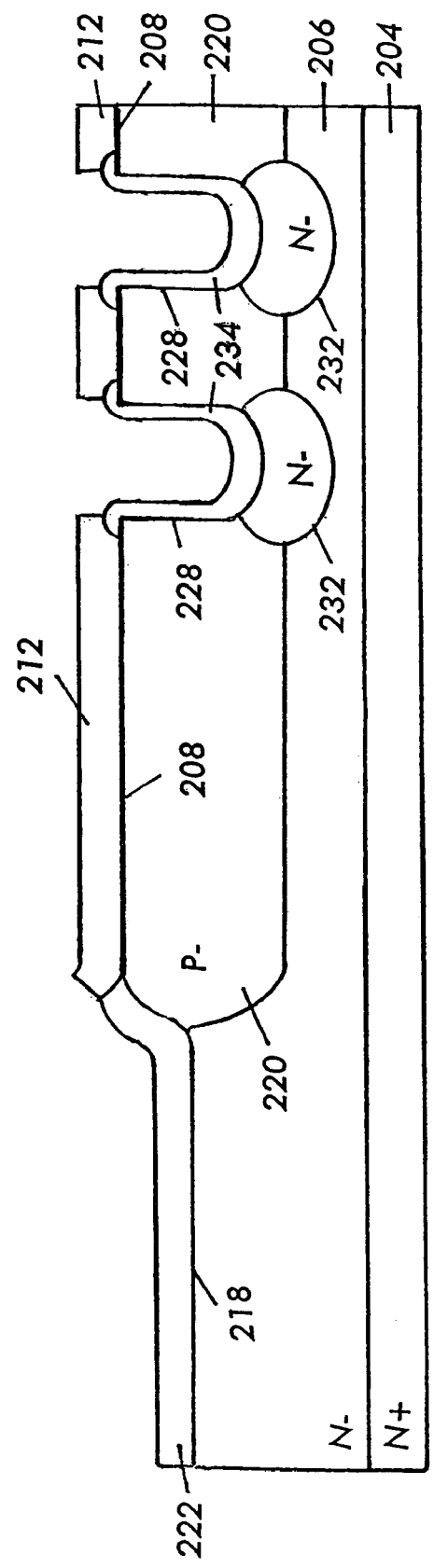

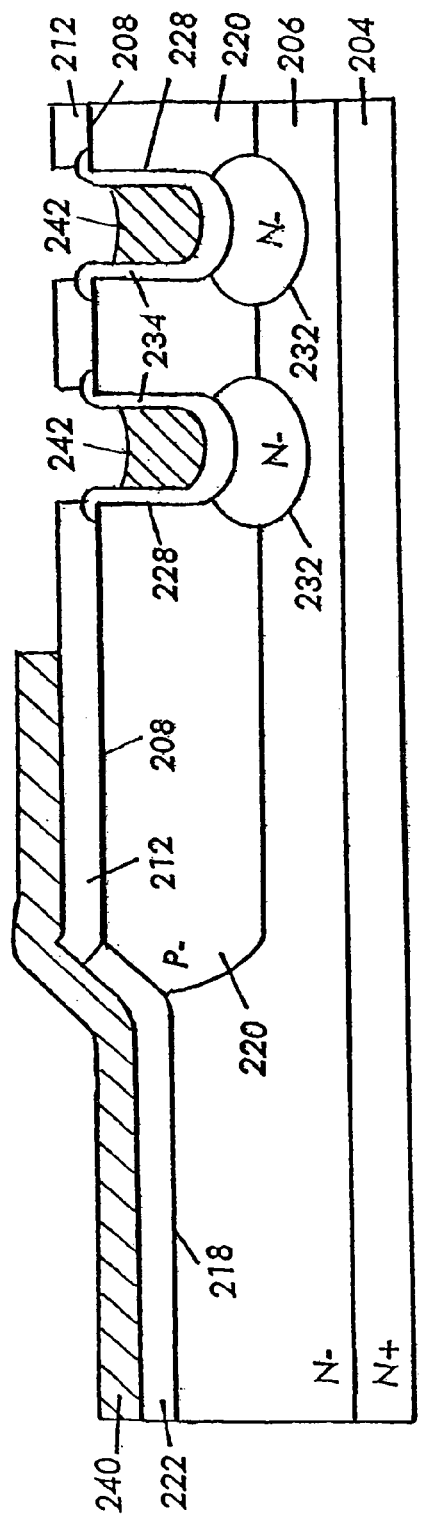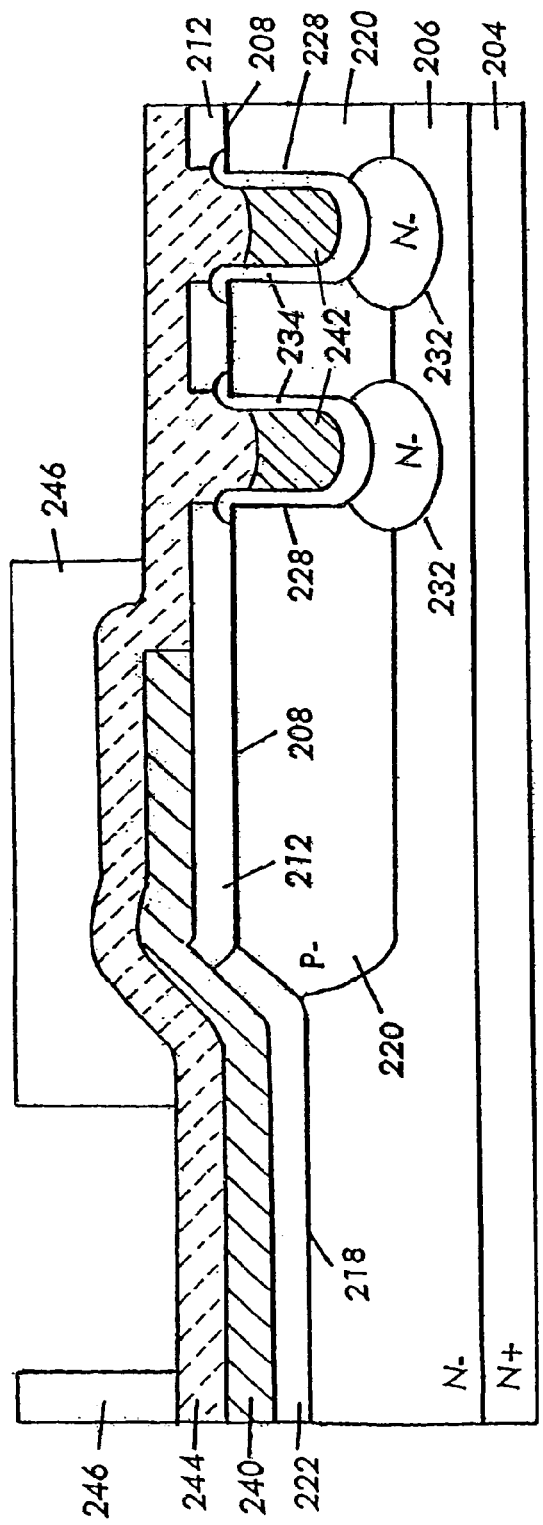

TRENCH MOSFET WITH TRENCH TIP IMPLANTS

RELATED APPLICATIONS

This application is based on and claims priority to U.S. Provisional Application No. 60/549,267, filed on Mar. 1, 2004, by David P. Jones, entitled, "Self Aligned Contact Structure for Trench Device," the contents of which are herein incorporated by reference.

BACKGROUND OF THE INVENTION

1. Field of the Invention

The present invention relates generally to semiconductor devices, and more specifically, to trench type power semiconductor devices and a method for fabricating the same.

2. Description of Related Art

Trench type power semiconductor devices such as power MOSFETs are well known. Referring to FIG. 1, an example of a power MOSFET 100 according to prior includes a plurality of trenches 12 formed in semiconductor body 14. Semiconductor body 14 is usually a silicon die that includes an epitaxially grown silicon layer (epitaxial silicon layer) 16 of one conductivity (e.g. N-type) formed over a silicon substrate 18 of the same conductivity, but of higher concentration of impurities. A channel region 20 (sometimes referred to as body region) is formed in epitaxial silicon layer 16 and extends from the top surface of the semiconductor body to a first depth. Channel region 20 has a conductivity opposite to that of epitaxial layer 16 (e.g. P-type). Formed within channel region 20 are source regions 22, which have the same conductivity (e.g. N-type) as epitaxial silicon layer 16.

As is well known, trenches 12 typically extend to a depth below the bottom of channel region 20 and include gate insulation 24, which may be formed with silicon dioxide, on at least the sidewalls of trenches 12. The bottom of each trench 12 is also insulated with silicon dioxide or the like. Gate electrodes 26 are disposed within each trench 12 and again, typically extend to a depth below the depth of channel region 20. Gate electrodes 26 are typically composed of conductive polysilicon.

A typical trench type power MOSFET further includes a source electrode 28, which is electrically connected to source regions 22, and high conductivity contact regions 30, which are also formed in channel region 20. High conductivity contact regions 30 are highly doped with dopants of the same conductivity as channel region 20 (e.g. P-type) in order to reduce the contact resistance between source electrode 28 and channel region 20. A typical trench type power MOSFET 10 further includes a drain electrode 32 in electrical contact with silicon substrate 18.

As is well known, the density of the current that power MOSFET 100 may accommodate is directly proportional to the cell density of the device. Thus, the greater the number of trenches per unit area the more current the device can handle. Because of this relationship, it is desirable to pack as many trenches as possible for a given die area. One way to accomplish this is by reducing the trench pitch, which, for example, requires reducing the width of source regions 22 and/or high conductivity contact regions 30. However, traditional fabrication processes can limit the amount of reduction that can be achieved in these dimensions, thereby affecting the amount of reduction that can be achieved in trench pitch.

As is also known, in prior art power semiconductor devices, such as MOSFET 100, trenches 12 must extend at least through the entire thickness of the channel region 20. Furthermore, the gate electrode 26 must also extend at least the length of the region that is to be inverted within the channel region. Naturally, when the thickness of the channel region is increased (e.g., to increase the breakdown voltage of the device) the gate trenches must be deeper and consequently the gate electrodes larger. Having larger gate electrodes is undesirable, however, as they include a larger volume of conductive material requiring a higher amount of charge to operate. Furthermore, a thicker channel region increases the on state resistance of the device as it increases the current path.

SUMMARY OF THE INVENTION

Accordingly, it would be desirable to produce a trench type power semiconductor device that overcomes the above and other disadvantages of the prior art. In accordance with an embodiment of the present invention, a trench type power semiconductor device includes a semiconductor body comprising a substrate and epitaxial silicon layer of a first conductivity and a channel region thereupon of a second conductivity. Across the surface of the semiconductor body are a plurality of gate electrode trenches. Significantly, these trenches are shallow and extend to a distance above the junction formed by the channel region and epitaxial silicon layer and as such, do not extend into the epitaxial silicon layer. For example, the bottom of each trench is preferably about 0.1 um or greater above the junction.

At the bottom of each trench within the channel region is a low concentration trench tip implant of the same conductivity as the epitaxial silicon layer. These trench tip implants extend through the channel region and into the epitaxial silicon layer. The trench tip implants reverse the doping in the regions immediately below each trench, effectively pulling up the drift region in a very localized fashion. Significantly, the trench tip implant concentration is low enough to deplete out in reverse bias but still high enough not to create a JFET.

In addition to the shallow trenches and tip implants, a semiconductor device according to the present invention includes a gate oxide that lines the bottom and sidewalls of each gate electrode trench. This gate oxide is such that it is thicker along the trench bottom than along the trench sidewalls. For example, the thickness of the gate oxide at the bottom of each trench can be targeted to be about 1.5 to 4 times the thickness of the gate oxide along the sidewalls of each trench.

Significantly, through the combination of the shallower trenches and the trench tip implants, adverse affects due to trench depth variations can be reduced. Also, on-state resistance can be improved without reducing the thickness of the channel region and thus compromising breakdown voltage. In addition, the shallower trenches allow for the gate resistance (Rg) and gate charge (Qg) of the gate electrodes of the device to be reduced. Also, the trench tip implants can reduce the gate-drain charge (Qgd) by about 40%, for example. The thick gate oxide along the bottom of the gate trenches further reduces the gate-drain charge (Qgd). Overall, because the gate-drain charge is reduced, the charge ratio, Qgd/Qgsb, of the device is improved (the ratio is less than 1).

In an example process according to the present invention for fabricating the above trench type power semiconductor device, once forming the channel region, the gate trenches are etched into the semiconductor body such that the trenches do not extend to the bottom of the channel region, as described above. Thereafter, the trench tip implants are formed at the bottom of each trench within the channel region using low dose, low energy dopants. Next, using a LOCOS process, the variable gate oxide is formed along the bottom and sidewalls of the trenches. Thereafter, gate electrodes are formed within the trenches such that the electrodes are recessed below the top surface of the semiconductor body, for example. After forming insulation plugs atop each gate electrode, source regions are then formed adjacent to and aligned to each trench. Thereafter, high conductivity contact regions are formed between adjacent source regions and trenches such that the contact regions are aligned to the source regions and trenches. Finally, source and drain contacts are then formed.

Other features and advantages of the present invention will become apparent from the following description of the invention, which refers to the accompanying drawings.

DETAILED DESCRIPTION OF THE PREFERRED EMBODIMENTS

Figure 1:
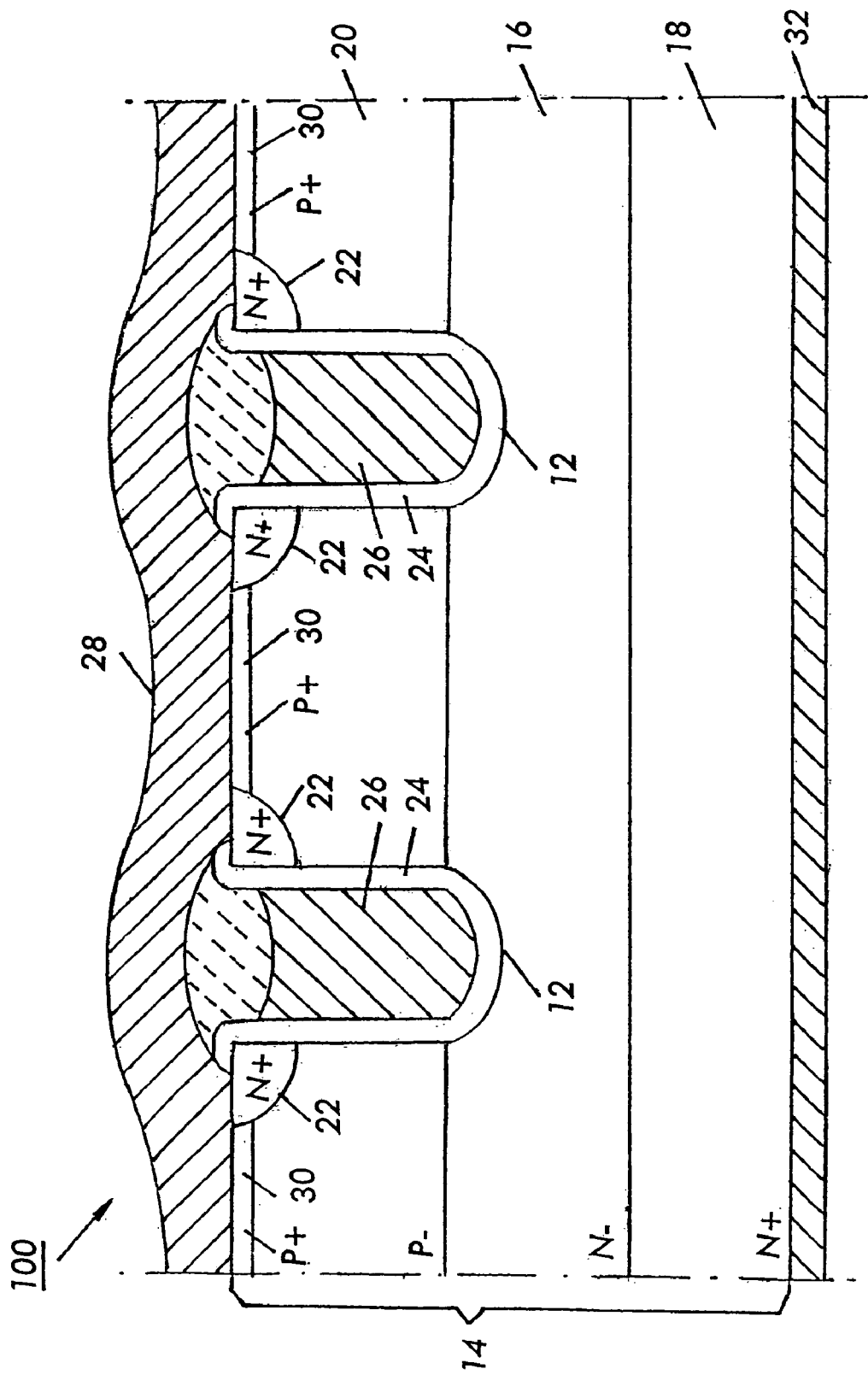
FIG. 1 shows a cross-sectional view of a portion of the active region of a trench type power MOSFET according to the prior art.
Figure 2:
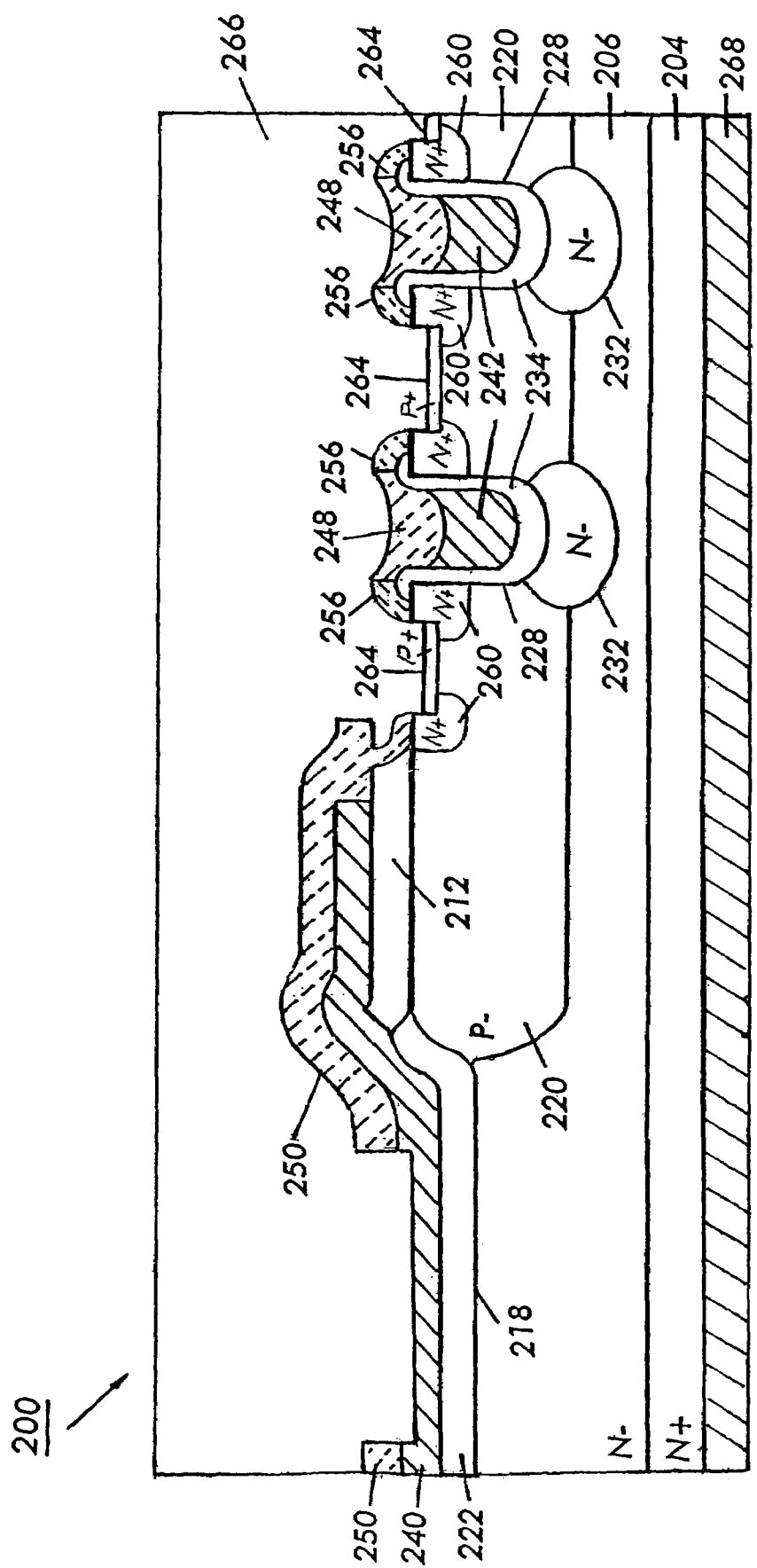
FIG. 2 shows a cross-sectional view of a portion of the active region a trench-type power MOSFET according to an embodiment of the present invention.

Referring to FIG. 2, a power MOSFET 200 in accordance with the present invention includes gate trenches 228 that are shallow and extend to a distance above the bottom of channel region 220 and do not extend into epitaxial silicon layer 206. Rather, at the bottom of each trench 228 is a low concentration trench tip implant 232, having the same conductivity as epitaxial silicon layer 206. These trench tip implants extend through channel region 220 and into underlying epitaxial silicon layer 206. The trench tip implants reverse the doping in the regions immediately below each trench 228, effectively pulling up the drift region in a very localized fashion. As also illustrated in FIG. 2, gate oxide 234 lining trenches 228 is thicker along the bottom of trenches 228 as compared to the sidewalls of the trenches.

Significantly, through the combination of shallower trenches 228 and trench tip implants 232, adverse affects due to trench depth variations can be reduced. Also, on-state resistance can be improved without reducing the thickness of the channel region and thus compromising breakdown voltage. In addition, the shallower trenches 228 allow for the gate resistance (Rg) and gate charge (Qg) of gate electrodes 242 of MOSFET 200 to be reduced. Also, trench tip implants 232 can reduce the gate-drain charge (Qgd) by about 40%, for example. The thick gate oxide 234 along the bottom of trenches 228 further reduces the gate-drain charge (Qgd). Overall, because the gate-drain charge is reduced, the charge ratio, Qgd/Qgsb, of MOSFET 200 is improved (the ratio is less than 1).

As further illustrated in FIG. 2, source regions 260 are self-aligned between adjacent gate trenches 228 and high conductivity contact regions 264 are self-aligned between adjacent source regions 260 and gate trenches 228, thereby reducing the trench pitch of the device. Specifically, in an example process further described below for fabricating MOSFET 200, oxide insulation plugs 248 are grown from the top of gate electrodes 242, which plugs are aligned to trenches 228. In turn, spacers 256 are formed along the walls of oxide insulation plugs 248 and are aligned to these plugs. Through spacers 256, source regions 260 and high conductivity contact regions 264 are formed, causing the source regions and high conductivity contact regions to be self-aligned between each other and trenches 228. As a result of forming the high conductivity contact regions of the present invention through this self-alignment procedure, the contact regions are not limited by prior fabrication processes, such as photolithography, and have a reduced width. For example, high conductivity contact regions 264 are only 0.2 microns wide. This reduced dimension allows the trench pitch of the device to be reduced to approximately 0.8 microns, as compared to prior trench pitches of approximately 1.8 microns. This reduced trench pitch allows power MOSFET 200 to have an increased cell density.

Figure 3A:
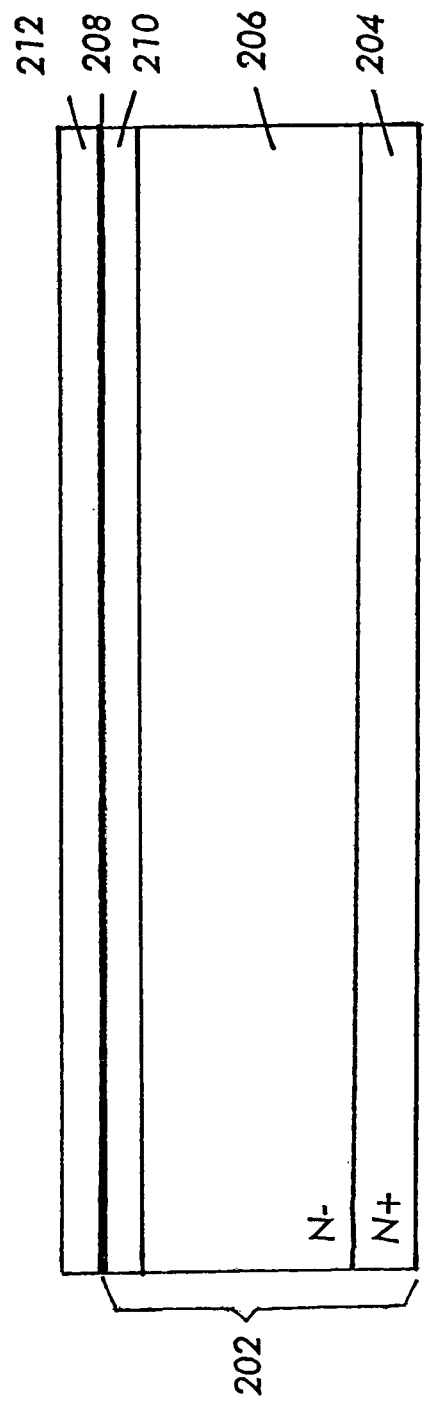
FIGS. 3A–3R graphically illustrate a process according to an embodiment of the present invention for fabricating the trench-type power MOSFET of FIG. 2.
Figure 3B:
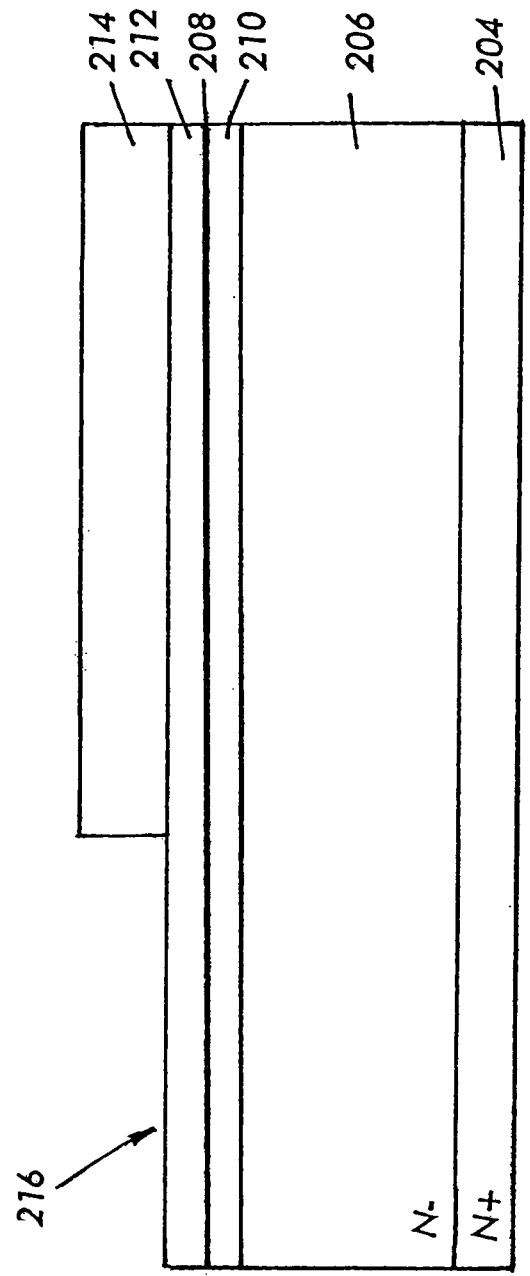
Figure 3I:
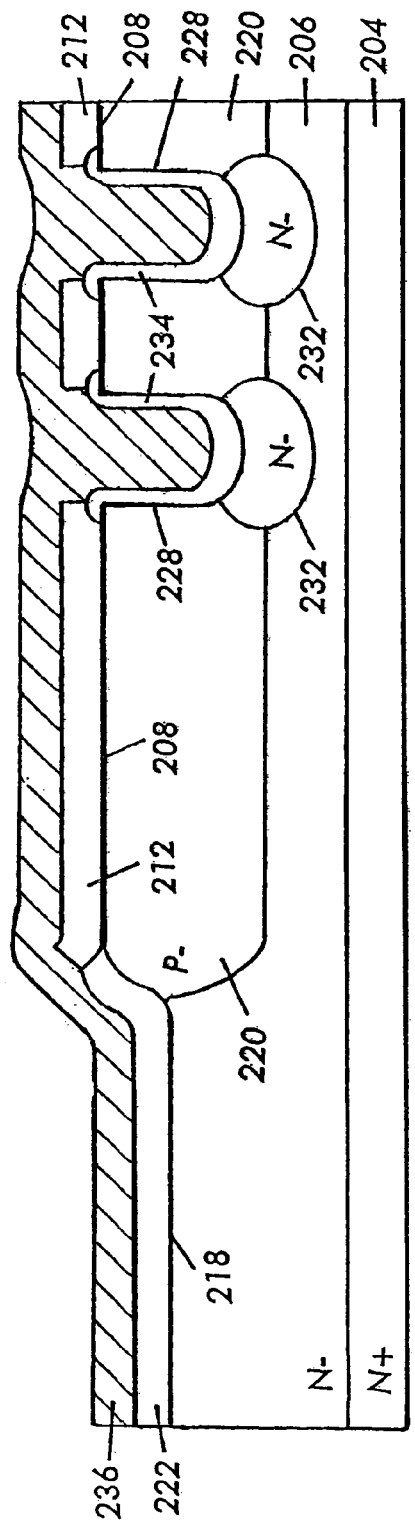
Figure 3J:
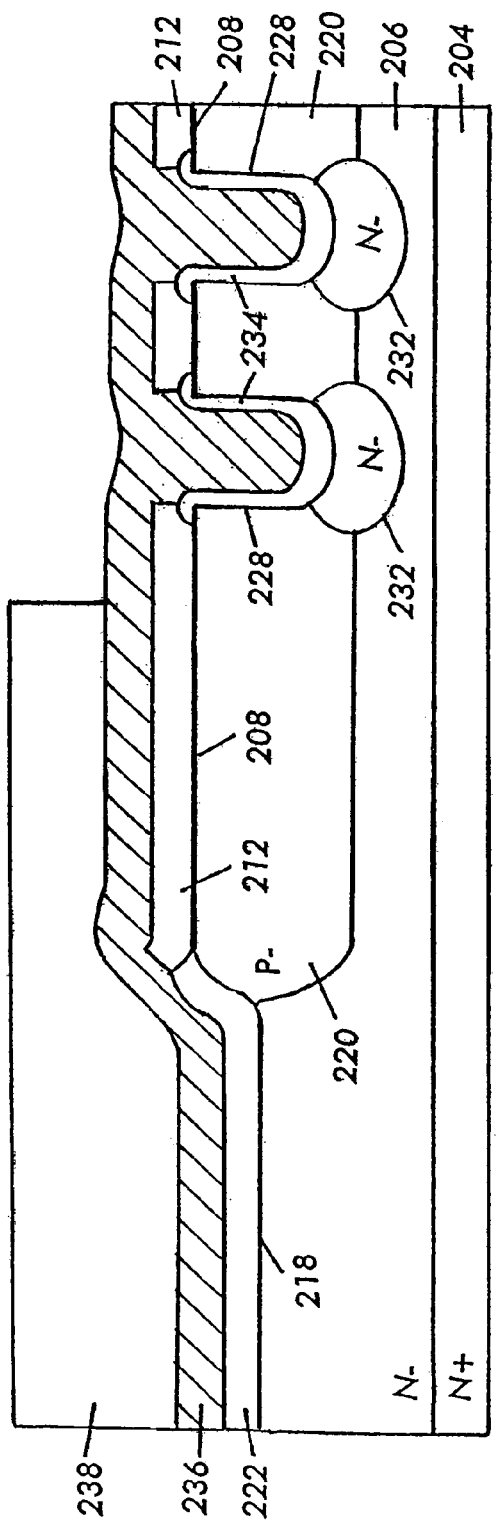
Figure 3M:
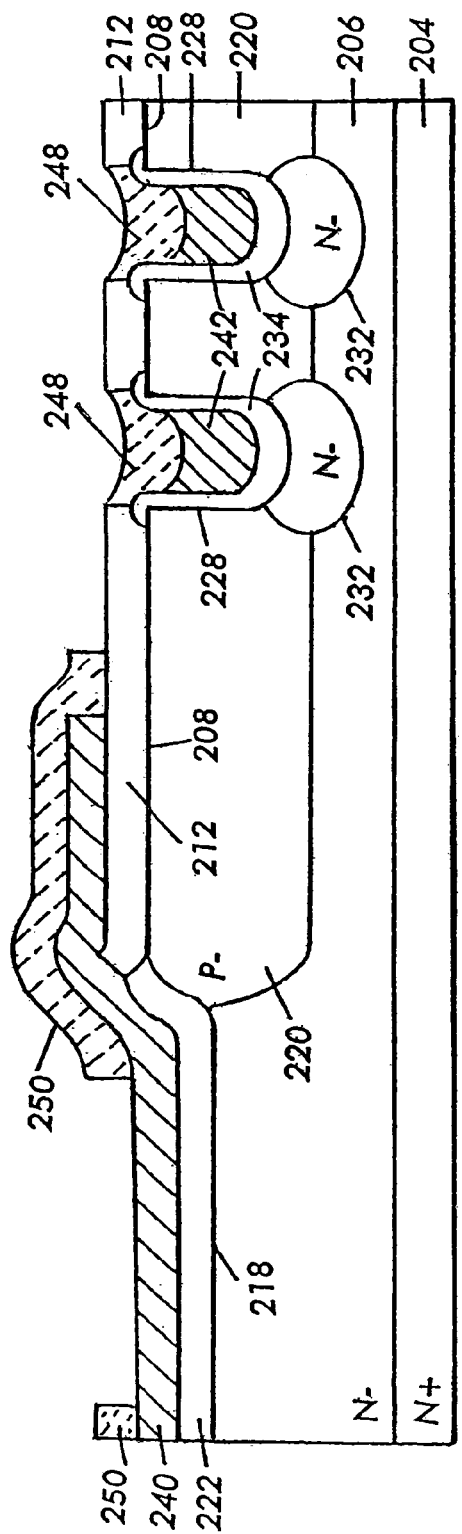
Figure 3N:
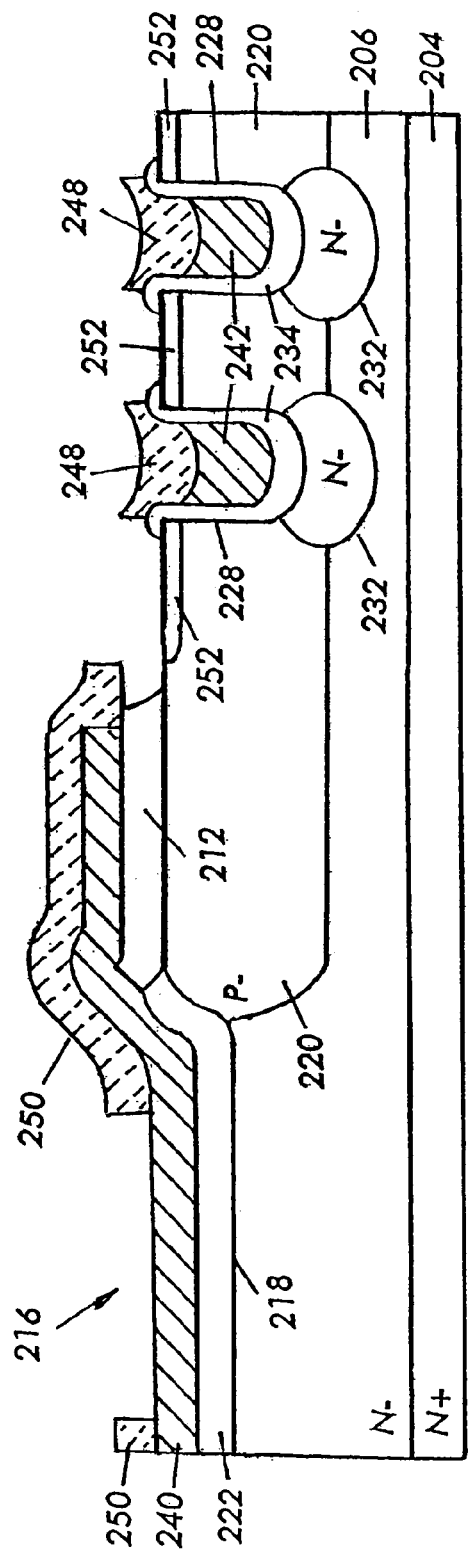
Figure 3O:
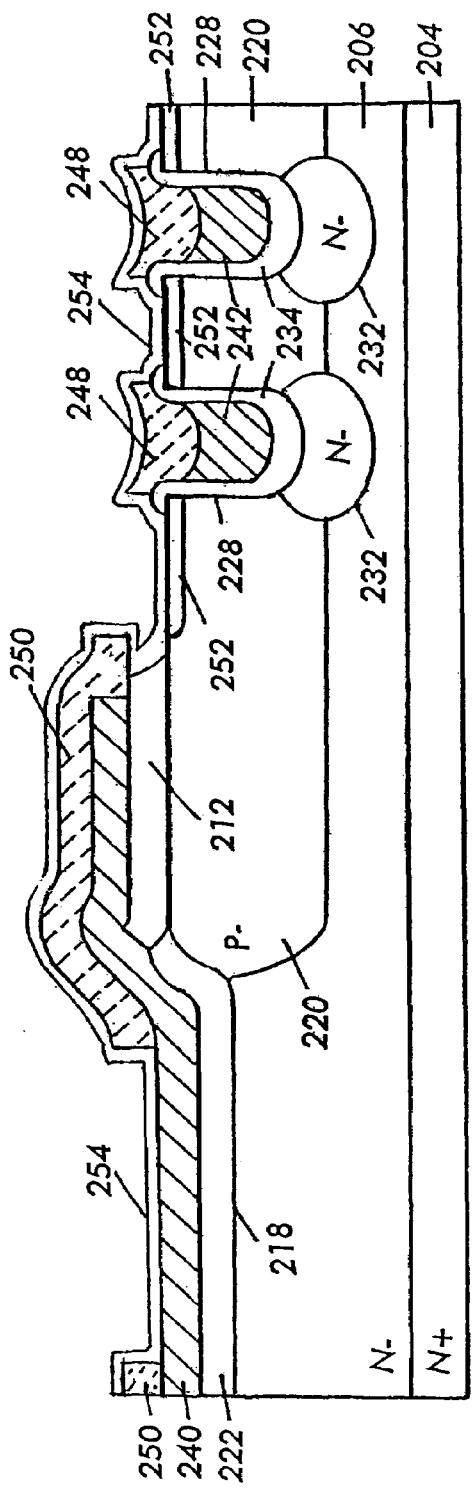
Figure 3P:
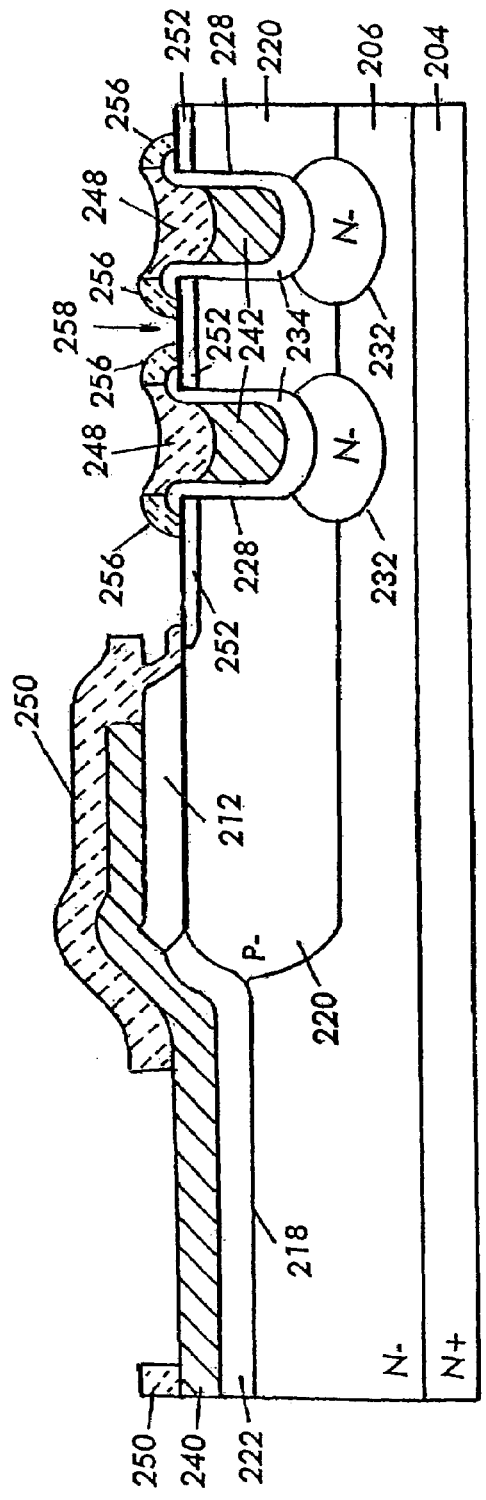
Figure 3Q:
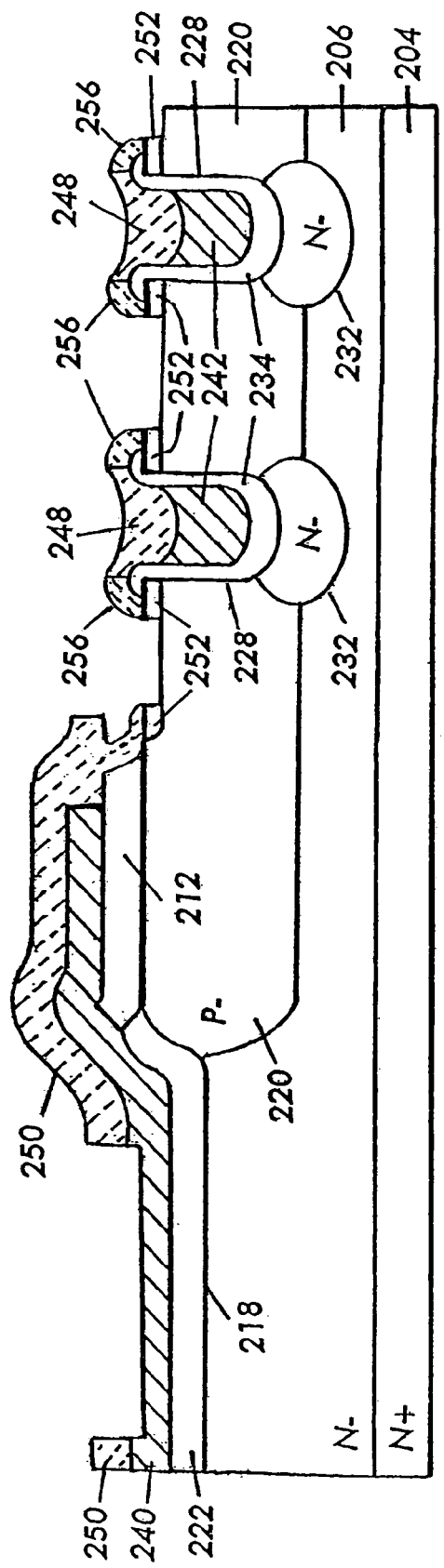
Figure 3R:
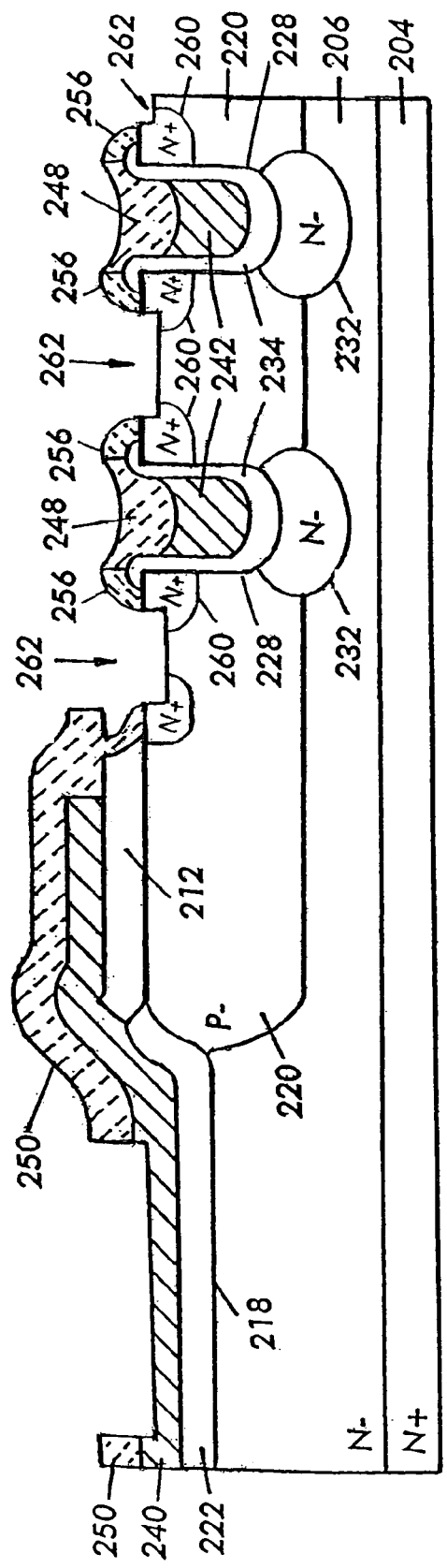

Referring now to FIGS. 3A–3R (note that the Figures are not drawn to scale), an example process for fabricating the trench type power MOSFET 200 of FIG. 2 according to an embodiment of the present invention is illustrated. Beginning with FIG. 3A, there is shown an initial silicon body 202. Silicon body 202 preferably includes a silicon substrate 204 of one conductivity (e.g., N-type) and epitaxial silicon layer 206 of the same conductivity (e.g., N-type) grown over one major surface of silicon substrate 204. As is known, epitaxial silicon layer 206 includes a lower concentration of dopants as compared to substrate 204. Preferably, epitaxial silicon layer 206 has a resistivity of approximately 0.21 Ohm cm. Once having epitaxial silicon layer 206, a pad oxide 208 is then formed on the surface thereof, at a thickness of preferably about 230 A. A channel implant is then carried out using dopants of a conductivity opposite to that of epitaxial silicon layer 206 (e.g. P-type) thereby forming channel implant region 210 within epitaxial silicon layer 206. Preferably, channel implant region 210 is formed using an ion dose and energy of 2.7E13 and 50 KeV, respectively. Note that channel implant region 210 is not driven/activated at this time. On the surface of pad oxide 208 a hard mask layer 212 is then formed, preferably composed of silicon nitride ($Si_3Ni_4$), at a thickness of approximately 4000 A or greater. As discussed below, this hard mask layer is retained through the formation of gate trenches 228 and oxide insulation plugs 248.

Referring to FIG. 3B, termination trench mask 214 is next formed on the surface of hard mask layer 212, exposing a portion of mask layer 212 along termination region 216. Termination trench mask 214 may be a layer of photoresist, for example, and thereby formed using a conventional photolithographic process. Thereafter, termination trench 218 is formed by etching a groove along the unmasked termination region 216. The groove extends through hard mask layer 212/pad oxide 208 and into epitaxial silicon layer 206 to a depth below channel implant region 210. Termination trench mask 214 is then removed. The resulting structure is shown in FIG. 3C.

Referring to FIG. 3D, a channel drive is next performed, preferably for 45 minutes at 1110° C., thereby forming channel region 220 within epitaxial silicon layer 206. Thereafter, field oxide 222 is simultaneously grown over the sidewall and the bottom of termination trench 218, preferably using a wet process at a temperature of 1050° C. for 70 minutes. Note that because of hard mask layer 212, only the bottom and the sidewall of termination trench 218 are oxidized during this step.

Referring to FIG. 3E, active trench mask 224 is next formed over the surface of the structure shown in FIG. 3D, this mask having spaced openings 226 that extend to the surface of hard mask layer 212 within the active area. Active trench mask 224 can be formed, for example, by applying a layer of photoresist and a mask with a desired trench pattern to the surface of the structure and then patterning the layer of photoresist using a suitable photolithographic process.

Referring to FIG. 3F, an active trench etch is next carried out through openings 226 to form trenches 228 within the active area of the structure. Significantly, note that the bottom of trenches 228 extend to a distance above the bottom of channel region 220 and as such, do not extend into epitaxial silicon layer 206. Specifically, the energy used to form channel implant region 210 and the drive used to form channel region 220 are targeted such that the trench etch results in trenches 228 that are shallower than channel region 220 by preferably about 0.1 um or greater (as illustrated by distance 230 in FIG. 2F).

Referring to FIG. 3G, using low dose, low energy dopants of the same conductivity as epitaxial silicon layer 206 (e.g. N-type), preferably phosphorous, trench tip implants 232 are formed at the bottom of trenches 228. Note that trench tip implants 232 extend through channel region 220 and into underlying epitaxial silicon layer 206. Again, trench tip implants 232 reverse the doping in the region immediately below each trench 228, effectively pulling up the drift region in a very localized fashion. Significantly, the trench tip implant concentration is low enough to deplete out in reverse bias but still high enough not to create a JFET. Once trench tip implants 232 are formed, active trench mask 224 is removed.

Referring to FIG. 3H, gate oxide 234 is next formed on the sidewalls and bottom of trenches 228 using a LOCOS process such that the oxide layer formed along the bottom of each trench 228 is thicker than the oxide layer formed along the sidewalls of each trench, as illustrated in the Figure. Specifically, a sacrificial oxide layer (SiO$_2$) is first simultaneously grown on the sidewalls and bottom of each trench 228 (note that this step and the following steps used to form gate oxide 234 are not shown in the Figures). A sacrificial oxide etch is then performed to completely remove this oxide layer. Next a pad oxide is formed on the sidewalls and bottom of each trench 228. Thereafter, a removable hard mask layer, preferably composed of silicon nitride, is deposited over the surface of the structure of FIG. 3G, including the sidewalls and bottom of trenches 228. Then, using a dry nitride etch, the hard mask layer is removed from the surface of the structure and from the bottom of each trench 228, thereby forming nitride spacers along the sidewalls of each trench 228 and exposing the bottom of each trench.

Thereafter, a thermally grown thick bottom oxide is formed along the bottom each trench 228. Significantly, the nitride spacers along the sidewalls of each trench prevent oxide growth on the sidewalls during this step. Next, a wet nitride etch is performed to strip the nitride spacers from the trench sidewalls. Finally, an oxide layer is thermally grown along the sidewalls and bottom of each trench, with the resulting structure shown in FIG. 3H. Again, the formation of gate oxide 234 in this fashion results in the oxide layer formed along the bottom of each trench being thicker than the oxide layer formed along the sidewalls of each trench. In particular, the thickness of gate oxide 234 at the bottom of each trench can be targeted to be about 1.5 to 4 times the thickness of gate oxide 234 along the sidewalls of each trench.

Referring to FIG. 3I, a layer of un-doped polysilicon 236 is next deposited on the surface of the structure of FIG. 3H, thereby filling trenches 228, and covering hard mask layer 212 and field oxide 222 along termination trench 218. Thereafter, POCl deposition and diffusion is carried out to make the polysilicon N type and conductive. The top surface of the structure is then deglassed.

Referring to FIG. 3J, polysilicon mask 238 is next formed partially over the surface of the structure of FIG. 3I, exposing the surface of doped polysilicon 236 substantially over the active area of the structure. Polysilicon mask 238 is preferably composed of silicon nitride and can be formed, for example, by applying a layer of silicon nitride to the structure of FIG. 3I and appropriately etching the same.

Next, using polysilicon mask 238 as an etch stop for end point detection, the exposed/unmasked polysilicon 236 over the active area is etched back using a timed plasma etch such that the unmasked polysilicon is removed from the surface of the structure, thereby exposing a portion of hard mask layer 212, and is further removed from within trenches 228 such that the polysilicon is recessed within the trenches to preferably about 2000 A below the top surface of the silicon. Polysilicon mask 238 is then removed. As a result of this step, field relief electrode 240 is formed over field oxide 222 in termination trench 218 and over a portion of hard mask layer 212, and gate electrodes 242 are formed within trenches 228, as illustrated in FIG. 3K.

Next, after growing a polyoxide atop gate electrodes 242 and field relief electrode 240 (not shown in the Figures), oxide layer 244 composed, for example, from TEOS, is formed over the surface of the structure of FIG. 3K, filling trenches 228 up above hard mask layer 212, as illustrated in FIG. 3L. In this way, a plug is grown over from the top of gate electrodes 242, as further described below. Thereafter, plug-termination contact mask 246 is partially formed over the surface of oxide layer 244, exposing the surface of oxide layer 244 over termination trench 218 and over the active area, as further illustrated in FIG. 3L. Plug-termination contact mask 246 is preferably composed of silicon nitride and can be formed, for example, by applying a layer of silicon nitride to the surface of the structure and appropriately etching the same.

Next, using plug-termination contact mask 246 as an etch stop for end point detection, the exposed oxide layer 244 is etched back thereby exposing a portion of field relief electrode 240 and exposing a portion of hard mask layer 212 within the active area. However, oxide layer 244 is left within trenches 228 substantially to the top surface of hard mask layer 212. In this way, oxide insulation plugs 248 are formed over the tops of gate electrodes 242. Significantly, plugs 248 are aligned to trenches 228. Thereafter, plug-termination contact mask 246 is removed, leaving insulation body 250 over field relief electrode 240. The resulting structure is illustrated in FIG. 3M.

Referring to FIG. 3N, a wet nitride etch is next carried out to completely remove hard mask layer 212 (except for that portion of the mask covered by field relief electrode 240 and insulation body 250), thereby leaving oxide insulation plugs 248. During this step, all or a portion of pad oxide 208 is also removed. Then, following a pre-source implant dry oxide etch, source implant regions 252 are formed in channel region 220 between trenches 228, as illustrated in FIG. 3N. Preferably, source implant regions 252 are formed using an ion dose and energy of 2E16 and 50 KeV, respectively. Note that the source implant is carried out using a photoresist mask that blocks the source from termination region 216.

Referring to FIG. 3O, spacer layer 254 is next formed over the surface of the structure shown in FIG. 3N. Spacer layer 254 preferably has a thickness of 1000 A or greater and is composed of TEOS or silicon nitride. Next, using an appropriate etching process, spacer layer 254 is etched back from the surface of the structure to expose the surface of source implants 252 and the surface of field electrode 240. Significantly, however, in etching back spacer layer 254, spacers 256 are formed along the walls of oxide insulation plugs 248, as illustrated in FIG. 3P (note that any remaining spacer layer 254 over insulation body 250 is shown as part of insulation body 250 in FIG. 3P). Note that spacers 256 cover a portion of source implant regions 252 immediately adjacent each trench 228. Significantly, spacers 256 are aligned to oxide insulation plugs 248 and thereby to trenches 228. As such, openings 258 formed between adjacent spacers are also aligned to oxide insulation plugs 248 and thereby to trenches 228.

Next, using spacers 256 as a mask, a contact etch is performed along the surface of source implant regions 252. This contact etch preferably removes approximately 1500 A or greater of silicon to ensure any unmasked portions of source implant regions 252 are removed, thereby exposing a portion of the top surface of channel region 220. Nonetheless, because of spacers 256, the source implant region immediately adjacent to trenches 228 is retained. Note that this etching step also establishes contact to the polysilicon gate runners (not shown in the Figures). It should also be noted that during this step, the exposed surface of field relief electrode 240 is also etched, removing a portion thereof. The resulting structure is shown in FIG. 3Q.

Referring to FIG. 3R, a source diffusion drive is next carried out to drive the remaining portions of source implant regions 252 that are masked by spacers 256, thereby forming source regions 260. Note that the source implant regions are preferably driven such that the resulting source regions 260 overlap gate electrodes 242 in trenches 228 by approximately 500 A or greater. Significantly, because of spacers 256, source regions 260 are self-aligned to trenches 228.

Referring to FIG. 2, using dopants of the same conductivity as channel region 220, a low energy contact implant is next performed in channel region 220 along the etched region created by the contact etch in FIG. 3Q (i.e., the area designated by arrow 262 in FIG. 3R). This implant is then driven using an RTA (rapid thermal annealing) process or furnace drive, thereby forming shallow high conductivity contact regions 264. Significantly, because of spacers 256, high conductivity contact regions 264 are self-aligned to source regions 256 and trenches 228. Again, by forming the high conductivity contact regions through this self-alignment procedure, the contact regions are not limited by prior fabrication processes, such as photolithography, and have a reduced width and can be, for example, only 0.2 microns wide. This reduced dimension allows the trench pitch to be reduced to approximately 0.8 microns, as compared to prior trench pitches of approximately 1.8 microns.

Finally, a front metal and back metal are applied using known methods to obtain source contact 266 and drain contact 268.

Note that FIGS. 2 and 3A–3R show N-type trench MOSFETs. Nonetheless, one skilled in the art will realize that the present invention also applies to P-type trench MOSFETS.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A power semiconductor device, comprising:
   a semiconductor body of a first conductivity type;
   a channel region of a second conductivity type in said semiconductor body and extending to a first depth within said semiconductor body;
   a plurality of trenches along a surface of said semiconductor body, said trenches extending into said channel region to a depth above said first depth, each trench including sidewalls and a bottom;
   a tip implant of said first conductivity type formed within said channel region at the bottom of each trench and extending through said channel region beyond said first depth and into said semiconductor body; and
   a gate electrode within each of said plurality of trenches;
   wherein each of said tip implants has a concentration that is low enough such that said tip implants deplete out when reversed biased and that is high enough so as to not form a JFET.

2. The power semiconductor device of claim 1, wherein said plurality of trenches each extend to a depth that is approximately 0.1 um or greater above said first depth.

3. The power semiconductor device of claim 1, further comprising an insulation layer lining the bottom and sidewalls of each of said plurality of trenches, wherein said insulation layer is thicker along the bottom of each trench than along the sidewalls of each trench.

4. The power semiconductor device of claim 3, wherein said insulation layer along the bottom of each trench is 1.5 to 4 times thicker than said insulation layer along the sidewalls of each trench.

5. The power semiconductor device of claim 1, further comprising a plurality of source regions of said first conductivity type within said channel region, each of said source regions being adjacent to one of said plurality of trenches.

6. The power semiconductor device of claim 5, wherein each of said plurality of source regions overlaps said gate electrode within said adjacent trench by approximately 500 A or more.

7. The power semiconductor device of claim 6,
   wherein each of said gate electrodes is recessed below a top surface of said semiconductor body by approximately 2000 A.

8. The power semiconductor device of claim 5, further comprising a plurality of contact regions of said second conductivity along the surface of said semiconductor body between adjacent source regions and adjacent trenches.

9. The power semiconductor device of claim 8, further comprising:
   a termination trench in said semiconductor body, said termination trench including a side wall and bottom and defining an active area that includes said plurality of trenches;
   a field insulation body over said sidewall and said bottom of said termination trench; and
   a termination electrode in said termination trench overlying said field insulation body and extending towards said active area.

10. The power semiconductor device of claim 9, further comprising an insulation body atop each of said gate electrodes, each insulation body extending above the surface of said semiconductor body and covering a portion of said source regions adjacent to the trench corresponding to said insulation body.

11. A method for fabricating a power semiconductor device, comprising the steps of:
   etching a plurality of trenches in a semiconductor body comprising an epitaxial silicon layer of a first conductivity and a channel region of a second conductivity formed atop said epitaxial silicon layer and extending to a first depth within said semiconductor body, wherein each of said plurality of trenches extends into said channel region to a depth above said first depth, each trench including sidewalls and a bottom;
   for each trench forming spacers substantially along the sidewalls, growing a first insulation layer on the bottom, removing said spacers from the sidewalls, growing a second insulation layer along the sidewalls and bottom thereby forming a resulting insulation layer that is thicker along the bottom than along the sidewalls;
   forming a tip implant of said first conductivity type within said channel region at the bottom of each trench such that each tip implant extends through said channel region beyond said first depth and into said epitaxial silicon layer; and
   forming a gate electrode within each of said plurality of trenches;
   wherein each of said tip implants has a concentration that is low enough such that said tip implants deplete out when reversed biased and that is high enough so as to not form a JFET.

12. The method of claim 11, wherein said plurality of trenches each extend to a depth that is approximately 0.1 um or greater above said first depth.

13. The method of claim 11, wherein said resulting insulation layer along the bottom of each trench is 1.5 to 4 times thicker than said resulting insulation layer along the sidewalls of each trench.

14. The method of claim 11, further comprising the step of forming a plurality of source regions of said first conductivity type within said channel region such that each source region is adjacent to one of said plurality of trenches.

15. The method of claim 14, wherein each of said plurality of source regions overlaps said gate electrode within said adjacent trench by approximately 500 A or more.

16. The method of claim 14, further comprising the step of forming a plurality of contact regions of said second conductivity within said channel region between adjacent source regions and adjacent trenches.

17. A method for fabricating a power semiconductor device, comprising the steps of:
   etching a plurality of trenches in a semiconductor body comprising an epitaxial silicon layer of a first conductivity and a channel region of a second conductivity formed atop said epitaxial silicon layer and extending to a first depth within said semiconductor body, wherein each of said plurality of trenches extends into said channel region to a depth above said first depth, each trench including sidewalls and a bottom;
   forming a tip implant of said first conductivity type within said channel region at the bottom of each trench such that each tip implant extends through said channel region beyond said first depth and into said epitaxial silicon layer;
   etching doped polysilicon within each of said plurality of trenches until the doped polysilicon is recessed below a top surface of said semiconductor body by approximately 2000 A, thereby forming a gate electrode within each of said plurality of trenches; and
   forming a plurality of source regions of said first conductivity type within said channel region such that each source region is adjacent to one of said plurality of trenches;
   wherein each of said plurality of source regions overlaps said gate electrode within said adjacent trench by approximately 500 A or more.

18. A method for fabricating a power semiconductor device, comprising the steps of:
   etching a plurality of trenches in a semiconductor body comprising an epitaxial silicon layer of a first conductivity and a channel region of a second conductivity formed atop said epitaxial silicon layer and extending to a first depth within said semiconductor body, wherein each of said plurality of trenches extends into said channel region to a depth above said first depth, each trench including sidewalls and a bottom;
   for each trench forming spacers substantially along the sidewalls, growing a first insulation layer on the bottom, removing said spacers from the sidewalls, growing a second insulation layer along the sidewalls and bottom thereby forming a resulting insulation layer that is thicker along the bottom than along the sidewalls;
   forming a tip implant of said first conductivity type within said channel region at the bottom of each trench such that each tip implant extends through said channel region beyond said first depth and into said epitaxial silicon layer; and
   forming a gate electrode within each of said plurality of trenches;
   forming a plurality of source regions of said first conductivity type within said channel region such that each source region is adjacent to one of said plurality of trenches;
   forming a plurality of contact regions of said second conductivity within said channel region between adjacent source regions and adjacent trenches;
   etching a termination trench in said semiconductor body prior to etching said plurality of trenches, said termination trench including a side wall and bottom and defining an active area that includes said plurality trenches;
   forming a field insulation body over said sidewall and said bottom of said termination trench; and
   forming a termination electrode over said field insulation body and extending towards said active area.

19. The method of claim 16, further comprising, prior to forming said plurality of source regions, the step of forming an insulation body atop each of said gate electrodes, each insulation body extending above the surface of said semiconductor body and covering portions of subsequently formed said plurality of source regions that are adjacent to the trench corresponding to said insulation body.

* * * * *